United States Patent
Araki et al.

(10) Patent No.: US 7,455,934 B1
(45) Date of Patent: Nov. 25, 2008

(54) FLUOROCOPOLYMER MATERIAL WITH SULFONIC ACID FUNCTIONAL GROUPS AS A SOLID POLYELECTROLYTE FOR USE IN FUEL CELLS

(75) Inventors: Takayuki Araki, Settsu (JP); Noritoshi Oka, Settsu (JP); Yoshito Tanaka, Settsu (JP); Takayuki Nakamura, Settsu (JP); Tetsuo Shimizu, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 09/700,185

(22) PCT Filed: May 10, 1999

(86) PCT No.: PCT/JP99/02398

§ 371 (c)(1),
(2), (4) Date: Dec. 18, 2000

(87) PCT Pub. No.: WO99/59216

PCT Pub. Date: Nov. 18, 1999

(30) Foreign Application Priority Data

May 13, 1998 (JP) ................................. 10-130421

(51) Int. Cl.
*H01M 10/08* (2006.01)

(52) U.S. Cl. ...................... 429/309; 429/314; 429/317; 521/28; 427/384; 204/252

(58) Field of Classification Search .................. 424/33, 424/304; 429/309, 314, 317; 204/252; 521/28; 427/384
See application file for complete search history.

(56) References Cited

U.S. PATENT DOCUMENTS 3,282,875 A * 11/1966 Connolly et al. ............. 524/795

(Continued)

FOREIGN PATENT DOCUMENTS

| JP | 06-260184 A | 9/1994 |
| JP | 11-204121 A | 7/1999 |
| WO | WO 82/02564 | 8/1982 |

OTHER PUBLICATIONS

Schmidt-Rohr, K. Physical chemistry of polymers; Iowa State University, 1999.*
Scherer et al., "Membrel-Water Electrolysis Cells with a Fluorinated Cation Exchange Membrane", *J. Elecrochem. Soc.*: Electrochemical Science and Technology, Dec. 1988, pp. 3071-3073.

*Primary Examiner*—Mark Ruthkosky
(74) *Attorney, Agent, or Firm*—B. Aaron Schulman; Stites & Harbison PLLC

(57) ABSTRACT

The invention is a material for a solid polyelectrolyte, comprising a multi-segmented fluoropolymer that comprises a block copolymer and/or a graft copolymer, wherein the copolymer contains one or more blocks essentially consisting of segment A and one or more blocks essentially consisting of segment B, the segment A combines with the segment B, wherein the segment A has a molecular weight of 5,000 to 1,000.000, and the Segment A is a copolymer chain comprising (a) an ethylenicfluoromonomer containing sulfonic acid functional groups each represented by Formula (1) $CX_2=CX^1-(O)_n-Rf-SO_2Y$, wherein X and $X^1$ may be the same or different and are each hydrogen or fluorine; Y is Fl, Cl, or $OY^1$ wherein $y^1$ is hydrogen, alkali metal or $C_1$-$C_5$ alkyl; Rf is $C_1$ to $C_{40}$ divalent fluoroalkylene or $C_1$ to $C_{40}$ divalent fluoroalkylene having one or more ether bonds; and n is 0 or 1; and (b) at least one type of ethylenic fluoromonomer copolymerizable with the ethylenic fluoromonomer (a) and containing no sulfonic acid functional groups, the segment B is a fluoropolymer containing no sulfonic acid functional groups, has a molecular weight of 3,000 to 1,200,000, and has a crystalline melting point of 100° C. or higher or a glass transition point of 100° C. or higher, wherein the ratio of segment A:segment B in the segmented fluoropolymer is 5:9~to 98:2 30:70 to 90:10 wt. %.

7 Claims, 1 Drawing Sheet

U.S. PATENT DOCUMENTS

| | | | |
|---|---|---|---|
| 3,692,569 A * | 9/1972 | Grot | 428/319.7 |
| 4,330,654 A * | 5/1982 | Ezzell et al. | 526/243 |
| 5,399,184 A | 3/1995 | Harada | |
| 5,422,411 A | 6/1995 | Wei et al. | |
| 5,498,639 A | 3/1996 | Wei et al. | |
| 5,523,180 A * | 6/1996 | Armand et al. | 429/188 |
| 5,547,551 A * | 8/1996 | Bahar et al. | 204/296 |
| 5,599,638 A * | 2/1997 | Surampudi | 429/33 |
| 5,635,039 A * | 6/1997 | Cisar et al. | 204/252 |
| 6,242,123 B1 * | 6/2001 | Nezu | 429/33 |
| 6,248,469 B1 * | 6/2001 | Formato et al. | 429/41 |
| 6,492,431 B1 * | 12/2002 | Cisar | 521/28 |
| 6,495,209 B1 * | 12/2002 | Cisar | 427/384 |

* cited by examiner

FLUOROCOPOLYMER MATERIAL WITH SULFONIC ACID FUNCTIONAL GROUPS AS A SOLID POLYELECTROLYTE FOR USE IN FUEL CELLS

TECHNICAL FIELD

The present invention relates to fluoropolymer materials suitable for solid polyelectrolytes, and solid polyelectrolyte membranes comprising the materials.

BACKGROUND ART

Fuel cells are electrochemical devices that convert chemical energy directly into electrical energy by oxidization of fuel supplied to the cells. Generally, a fuel cell comprises two gas diffusion electrodes adjacent to and in contact with an electrolyte, and includes a means for supplying fuel to the positive electrode and supplying an oxidant to the negative electrode. The electrolyte, either solid or liquid, is located between the electrodes and transfers ions between the positive and negative electrodes.

One type of fuel cell utilizes a proton exchange polymer film as the electrolyte. In this type of fuel cell, a plurality of acid functional groups chemically bonded to the polymer main chain of the polymer film have an electrolytic action. The proton exchange polymer film may be made of, for example, sulfonated polystyrene, or preferably a substantially fluorinated sulfonic acid polymer such as a Nafion ion exchange polymer film manufactured by Du pont. The term "solid polyelectrolyte" is often used to indicate any of these ion exchange polymer film structures.

Proton exchange polymer film fuel cells are known, and disclosed in, for example, U.S. Pat. No. 3,134,697. Early solid polyelectrolyte proton exchange polymer film fuel cells were operable, but had a limited life because of the chemical instability of the polymer film as such. However, subsequently developed perfluorinated polymer materials having ion exchange activity, such as Nafion manufactured by Du pont, enabled provision of fuel cells of the above type which have good operation properties and a several thousand hour life.

A solid polyelectrolyte fuel cell comprising Nafion (perfluorosulfonic acid polymer film) is operated generally at about 80° C. Since the polymer film as such is substantially gas-impermeable, the cell does not necessitate any porous support matrix for preventing mixing of gases, which is usually employed when using a liquid electrolyte fuel cell. By using a suitable external support, a pressure difference of 100 psi or more can be provided between the fuel gas and oxidant gas in practical operation. These characteristics are remarkably advantageous. When the fuel cell is operated using, as an oxidant, air with an increased pressure to raise the oxygen partial pressure, compression of the fuel gas becomes unnecessary. For example, a hydrogen/air fuel cell can be operated using fuel at 1 atmosphere and air (oxidant) at 4 atmospheres or more.

In practice, the electrodes are physically bonded to the active proton exchange polymer film by application of pressure or heat (e.g., U.S. Pat. No. 4,272,353).

In the present state of the art, perfluorosulfonic acid polymer films manufactured by Du pont, as described in U.S. Pat. No. 3,282,875, are used as films having an equivalent weight of about 1100 to 1200. Equivalent weight means the weight of a polymer necessary for neutralizing 1 equivalent of a base. It is presumed that the ion conductivity of a polymer film is in inverse proportion to the equivalent weight of the polymer film. There is a film of Nafion ion exchange polymer having a lower equivalent weight than the polymer film conventionally employed in the art (EP Patent Application No. 0122049). However, polymer films having an equivalent weight less than about 950 have low physical stability as described in "Dual Cohesive Energy Densities of Perfluorosulphonic Acid (Nafion) Membrane" (Polymer, vol. 21, pp. 432-435, April, 1980). Thus, such polymer films have handling difficulties during assembling of a cell unit, or produce creep during assembling or operation of a cell, thus causing voltage loss or short circuit and losing reliability. A proton exchange solid polyelectrolyte with a reduced equivalent weight is strongly desired in order to decrease the resistance loss of ion transfer in fuel cells while maintaining acceptable properties of the cells.

A variety of attempts have been made to solve the problems of solid polyelectrolyte films.

For example, International Patent Application Translation Publication No. 1987-500759 states that the structure of the Nafion ion exchange polymer having sulfonic acid groups in the polymer side chain is modified, i.e., the sulfonic acid group-containing side chain structure is made shorter. As a result, according to the publication, the polymer has a lower equivalent weight (less than 1000) and an improved storage elastic modulus at a high temperature (110° C. or higher). In this technique, the glass transition point or softening point of the Nafion ion exchange polymer (about 110° C.) is raised to improve the high-temperature mechanical properties. However, sulfonic acid group-containing polymers, including Nafion ion exchange polymers, are intrinsically amorphous or have an extremely low crystallinity even if they have a crystalline moiety. Therefore, these polymers are insufficient in mechanical properties at room temperature or high temperatures.

Further, it is very difficult to synthesize the disclosed sulfonic acid group-containing polymers whose sulfonic acid group-containing side chain is short. Therefore, such polymers are disadvantageous in productivity and cost.

Japanese Unexamined Patent Publication No. 1994-231778 discloses a blend of at least two perfluorocarbon polymers having sulfonic acid groups, which polymers are different in ion exchange capacity, for use in a solid polyelectrolyte fuel cell. According to the publication, the blend has high ion exchange capacity and contributes to high mechanical strength.

However, the publication discloses a mere blend of a perfluorocarbon polymer having a large amount of sulfonic acid group-containing units and a perfluorocarbon polymer having a small amount of sulfonic acid group-containing monomer units. Therefore, the mechanical strength of the blend is middle between the mechanical strengths of the unblended polymers. Moreover, the polymer with low ion exchange capacity (with small sulfonic acid group content), which contributes to the mechanical strength, do not have significantly high mechanical properties, and thus is not capable of giving the blend sufficient mechanical strength. Furthermore, it is difficult to homogeneously blend the polymers, thus resulting in impaired proton transfer properties.

Japanese Unexamined Patent Publication No. 1994-231781 describes a solid polyelectrolyte fuel cell comprising a laminate of at least two perfluorocarbon polymers containing sulfonic acid groups, which polymers are different in water content. In this technique, the perfluorocarbon polymer with a low water content (with a small amount of sulfonic acid group-containing monomer units) in the laminate is intended to contribute to high mechanical strength. However, the low water-content polymer as such has insufficient mechanical strength, and the layer of the polymer is thin, and therefore the laminate does not have sufficiently improved mechanical strength. Moreover, the laminated layers have a high water-content portion, and a low water-content having low ion transfer properties. Thus, the laminate as a whole has reduced proton transfer properties.

The present invention has been accomplished in view of the above problems of the prior art.

An object of the present invention is to provide a solid polyelectrolyte material having necessary and sufficient hydrogen ion conductivity (ion exchange group concentration) for use in a fuel cell comprising a sulfonic acid group-containing fluoropolymer, the material also having necessary and sufficient mechanical properties and durability for assembling, processing or use of the fuel cell.

DISCLOSURE OF THE INVENTION

Figure 1:
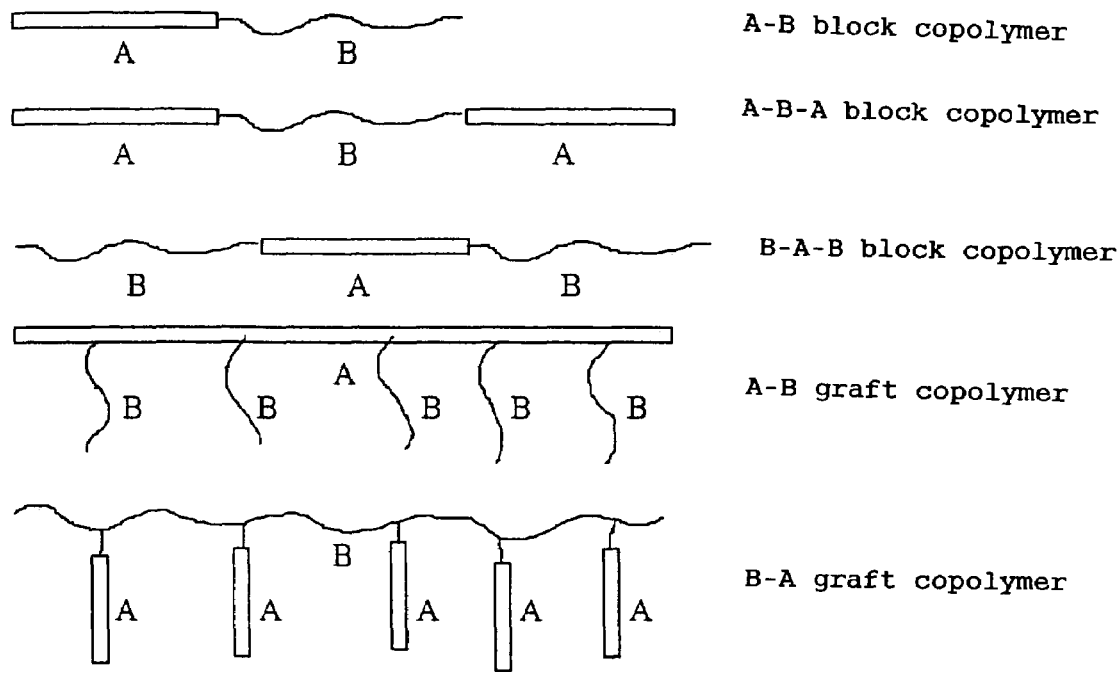
FIG. 1 is a conceptual view showing a polymer having a segmented polymer chain A and a segmented polymer chain B.

The present inventors found that a segmented fluoropolymer comprising a fluoropolymer chain segment containing sulfonic acid functional groups capable of giving ion conductivity, and a fluoropolymer chain segment capable of contributing to improvement of mechanical properties, can more effectively improve the mechanical properties without reduction in ionic conductivity.

The segmented fluoropolymer can be preferably used as a material for a solid polyelectrolyte, or as a solid polyelectrolyte membrane prepared from the material. Further, the segmented fluoropolymer is suitable as a material for use in a fuel cell.

The solid polyelectrolyte material of the invention comprises a multi-segmented fluoropolymer having at least two types of fluoropolymer chain segments differing in composition of monomers forming the polymers, at least one type of the fluoropolymer chain segments containing sulfonic acid functional groups capable of imparting ion conductivity.

As used herein, the term "sulfonic acid functional group" means $SO_3M$ (wherein M is hydrogen, an alkali metal salt, an alkaline earth metal salt, or an ammonium cation wherein a proton is added to ammonia, primary amine, secondary amine or tertiary amine), $SO_2Cl$ or $SO_2F$. Preferred sulfonic acid functional groups are $SO_3H$, $SO_2Cl$ and $SO_2F$.

Rf represents a $C_1$ to $C_{40}$ divalent fluoroalkylene group or a $C_1$ to $C_{40}$ divalent fluoroalkylene group having ether bond(s); preferably a divalent fluoroalkylene group or a divalent fluoroalkylene group having ether bond(s), which consists solely of fluorine atom(s), hydrogen atom(s) or halogen atom(s) other than fluorine; more preferably a divalent fluoroalkylene group or a divalent fluooroalkylene group having ether bond(s), which is free from hydrogen and consists solely of halogen atom(s), particularly fluorine atom(s).

Examples of $C_1$-$C_{40}$ divalent fluoroalkylene groups include —$(CF_2)_m$—; —$(CF_2CF(CF_3))_{m1}$—; —$(CF(CF_3)CF_2)_{m1}$—; —$(CF_2CFCl)_{m2}$—; —$(CF_2CH_2)_{m2}$—; —$(CF_2)_{m3}$—$(CF_2)_{m4}$— and —$(CF_2CF(CFCl_2))_{m3}$— [wherein m is an integer of 1 to 40, m1 is an integer of 1 to 13, m2 is an integer of 1 to 20, m3≧1, m4≧1 and 1≦m3+m4≦40].

Examples f $C_1$-$C_{40}$ divalent fluoroalkylene groups having ether bond(s) include —$(CF_2CF_2O)_{m2}$—; —$(CF_2CF(C_3)O)_{m1}$—; —$(CF_2CF_2CF_2O)_{m1}$—; —$(CF_2CF_2CH_2O)_{m1}$—; —$CF_2O(CF_2CF(CF_3)O)_{m1}$—; —$CF_2O(CF_2CF_2O)_{m5}$— and —$(CF_2CF(CFCl_2)O)_{m1}$— [wherein m1 and m2 are as defined above, and m5 is an integer of 1 to 19].

The multi-segmented fluoropolymer for use in the solid polyelectrolyte according to the invention comprises a fluoropolymer chain segment containing sulfonic acid functional groups and having ion conductivity (Segment A) and a fluoropolymer chain segment capable of imparting mechanical strength and durability to the whole polymer (Segment B). For improving the mechanical strength of the whole polymer, it is preferable that the fluoropolymer chain segment B is a crystalline polymer chain, or an amorphous polymer chain having a high glass transition point. Specifically stated, the multi-segmented fluoropolymer preferably has a fluoropolymer chain segment (Segment B) having a crystalline melting point or glass transition point of 100° C. or higher, more preferably 200° C. or higher.

Alternatively, the segmented fluoropolymer according to the invention may comprise a fluoropolymer chain segment having higher ion conductivity because of its high sulfonic acid functional group content (a small equivalent weight) (Segment C) and a fluoropolymer chain segment having higher mechanical strength and durability (Segment D).

Also in this case, the fluoropolymer chain Segment D is preferably a crystalline polymer chain or an amorphous polymer chain having a high glass transition point. Specifically stated, Segment D is a polymer chain segment having a crystalline melting point or glass transition point of 100° C. or higher, more preferably 200° C. or higher.

It is essential that the multi-segmented fluoropolymer for use in the solid polyelectrolyte material of the invention be a fluoropolymer comprising, in one molecule, a fluoropolymer chain segment containing sulfonic acid functional groups (Segment A) and a fluoropolymer chain segment containing no sulfonic acid functional groups (Segment B), Segments A and B being combined in the form of blocks or a graft; or a fluoropolymer comprising, in one molecule, a fluoropolymer chain segment with a higher sulfonic acid functional group content (Segment C) and a fluoropolymer chain segment with a lower sulfonic acid functional group content (Segment D), Segments C and D being combined in the form of blocks or a graft.

In the present invention, a variety of known processes can be employed to combine Segment A with Segment B, or Segment C with Segment D in the form of blocks or a graft to obtain a multi-segmented fluoropolymer. Among these processes, preferred are a process for preparing a multi-segmented block fluoropolymer disclosed in Japanese Examined Patent Publication No. 1983-4728 and other publications; and a process for preparing a multi-segmented graft fluoropolymer disclosed in Japanese Unexamined Patent Publication No. 1987-34324.

Particularly preferred is a multi-segmented block fluoropolymer prepared by the so-called iodine transfer polymerization process described in Japanese Examined Patent Publication No. 1983-4728 and Kobunshi Ronbunshu (Japanese Journal of Polymer Science and Technology, Vol. 49, No. 10, 1992).

Generally, a mere blend of a sulfonic acid functional group-containing fluoropolymer (a homopolymer corresponding to Segment A) and a fluoropolymer having higher mechanical properties than the sulfonic acid functional group-containing fluoropolymer (a homopolymer corresponding to Segment B) is insufficient in mechanical properties, or has reduced ion conductivity, although depending on the kinds, miscibility, compatibility and like characteristics of the polymers in the blend.

In contrast, the multi-segmented polymer according to the present invention is obtained by combining a sulfonic acid functional group-containing fluoropolymer chain segment (Segment A) with a fluoropolymer chain segment (Segment B) in the form of blocks or a graft; or by combining Segment C with Segment D in the form of blocks or a graft. As a result, the polymer according to the invention is remarkably improved in mechanical properties, high-temperature mechanical properties and heat resistance and other characteristics, as compared with the above-mentioned mere blend of polymers corresponding to Segments A and B. Further, when the polymer of the invention is used as a solid polyelectrolyte material in a fuel cell, it effectively improves the heat resistance, durability and creep resistance, thus increasing the reliability. Moreover, the polymer of the invention has higher ion conductivity than the blend of the segments, since the polymer has, in one molecule, Segment A (or Segment C) having ion conductivity and Segment B (or Segment D) capable of imparting mechanical properties, and consists of polymer molecules having more homogeneous composition.

The first preferred embodiment of the multi-segmented fluoropolymer for use in the solid polyelectrolyte of the invention comprises:

(Segment A) a fluoropolymer chain segment containing sulfonic acid functional groups; and (Segment B): a polymer chain segment containing no sulfonic acid functional groups.

The second preferred embodiment of the multi-segmented fluoropolymer for use in the solid polyelectrolyte of the invention comprises:

(Segment C) a fluoropolymer chain segment with a higher sulfonic acid functional group content; and (Segment D) a polymer chain segment with a lower sulfonic acid functional group content.

Segment A in the multi-segmented fluoropolymer for use in the solid polyelectrolyte of the present invention contains sulfonic acid functional groups to impart ion conductivity necessary for a solid polyelectrolyte. Specifically stated, Segment A is a copolymer chain containing:

(a) a fluoromonomer unit containing sulfonic acid functional groups; and (b) at least one type of ethylenic fluoromonomer unit compolymerizable with the monomer unit (a) and containing no sulfonic acid functional groups.

Segments C and D in the multi-segmented fluoropolymer for use in the solid polyelectrolyte of the invention have sulfonic acid functional groups to impart ion-conductivity necessary for a solid electrolyte. Specifically stated, Segments C and D are each a copolymer chain containing:

(c) the above ethylenic fluoromonomer unit containing sulfonic acid functional groups; and (d) at least one ethylenic fluoromonomer unit compolymerizable with the unit (c) and containing no sulfonic acid functional groups.

Specifically stated, the sulfonic acid functional group-containing ethylenic fluoromonomer units (a) and (c), which form Segment A, C or D, are each a monomer represented by Formula (1)

(1)

wherein X and X$^1$ are the same or different, and are each hydrogen or fluorine; Y is F, Cl or OY$^1$ (Y$^1$ is hydrogen, alkali metal or C$_1$ to C$_5$ alkyl); Rf is C$_1$ to C$_{40}$ divalent fluoroalkylene or C$_1$ to C$_{40}$ divalent fluoroalkylene having ether bond(s); and n is 0 or 1. Particularly preferred is a monomer represented by Formula (2)

 (2)

wherein Y and Rf are as defined for Formula (1). Specific examples of the monomers of Formula (2) include:

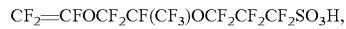

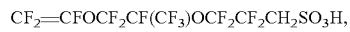

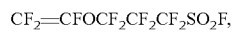

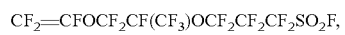

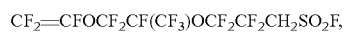

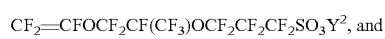

(wherein Y$^2$ is an alkali metal).

The monomer units (b) and (d) constituting Segment A, C or D may be each a monomer unit other than the monomer units (a) and (c), but are selected from ethylenic fluoromonomers containing substantially no functional groups. Specific examples include tetrafluoroethylene (TFE), hexafluoropropylene (HFP), chlorotrifluoroethylene (CTFE), vinylidene fluoride (VdF), vinyl fluoride, perfluoro(alkylvinyl ethers) (PAVEs), hexafluoroisobutene, CH$_2$=CF—(CF$_2$)$_n$—X and CH$_2$=CH—(CF$_2$)$_n$—X (wherein X is H, Cl or F; and n is an integer of 1 to 5).

In addition to the ethylenic fluoromonomer, a fluorine-free ethylenic monomer may be used in the copolymerization, within a range that does not lower the alkali resistance, heat resistance or heat durability. The optional fluorine-free ethylenic monomer, when employed, is preferably an ethylenic monomer having 5 or less carbon atoms so as not to reduce the heat resistance. Specific examples of such ethylenic monomers include ethylene, propylene, 1-butene and 2-butene.

From the viewpoints of ion conductivity, acid resistance, alkali resistance, heat resistance and durability, it is preferable that Segments A, C and D are each a copolymer chain having a sulfonic acid functional group-containing monomer unit represented by Formula (2) and a perhaloolefin unit, in particular a copolymer chain having a sulfonic acid functional group-containing monomer unit represented by Formula (2) and a tetrafluoroolefin unit.

The sulfonic acid functional group content of Segment A, i.e., the amount of the sulfonic acid functional group-containing fluoromonomer unit relative to the polymer chain segment A alone, is selected according to desired ion conductivity and mechanical properties of the polyelectrolyte, and is usually 5 mol % to 80 mol %, preferably 7 mol % to 70 mol %, more preferably 10 mol % to 50 mol %.

Segment B in the multi-segmented fluoropolymer comprising Segments A and B according to the invention is not limited as long as it is a polymer chain capable of imparting necessary mechanical properties to a solid polyelectrolyte, and can be selected according to the kind of Segment A and the purposes. As described before, it is preferable that Segment B is a crystalline polymer chain, or an amorphous polymer chain having a high glass transition point of 100° C. or higher, in particular 200° C. of higher.

Among monomers which can form Segment B, usable fluoropolymers include, for example, at least one of TFE, CTFE, PAVE, HFP, $CF_2=CF—(CF_2)_p—X$ (wherein p is an integer of 1 to 10, and X is F or Cl), perfluoro-2-butene and like perhaloolefins, VdF, vinyl fluoride, trifluoroethylene, $CH^2=CX^1 (CF_2)_q—X^2$ (wherein $X^1$ and $X^2$ are each H or F, and q is an integer of 1 to 10), $CH_2=C(CF_3)_2$ and like partially fluorinated olefins. Also, at least one monomer copolymerizable with the above monomers, such as ethylene, propylene, vinyl chloride, vinyl ethers, vinyl carboxylate esters or acrylic monomers, can be used as a copolymerization component.

From the viewpoints of acid resistance, alkali resistance, heat resistance and durability, preferably usable as the main component is a fluoroolefin by itself, a combination of fluoroolefins, a combination of ethylene with TFE, and a combination of ethylene with CTFE. Particularly preferred is a combination of perhaloolefins.

Specific examples of usable main components are:
(1) VdF/TFE (0~100/100~0), in particular VdF/TFE (70~99/30~1), PTFE or PVDF;
(2) ethylene/TFE/HFP (6~43/40~81/10~30), 3,3,3-trifluoropropylene-1,2-trifluoromethyl-3,3,3-trifluoropropylene-1/PAVE (40~60/60~40);
(3) TFE/$CF_2=CF—Rf$ (wherein Rf is as defined above, the percentage of $CF_2=CF—Rf$ being less than 15 mol %);
(4) VdF/TFE/CTFE (50~99/30~0/20~1);
(5) VdF/TFE/CTFE (50~99/30~0/20~1);
(6) ethylene/TFE (30~60/70~40);
(7) polychlorotrifluoroethylene (PCTFE); and
(8) ethylene/CTFE (30~60/70~40).

Among the above examples, particularly preferred is a polymer chain comprising 85 mol % to 100 mol % of tetrafluoroethylene and 15 mol % to 0 mol % of a monomer represented by Formula

$$CF_2=CF—Rf^a \quad (3)$$

wherein $Rf^a$ is $CF_3$ or $ORf^b$ (wherein $Rf^b$ is $C_1$ to $C_5$ perfluoroalkyl). When the polymer chain is combined with the above-mentioned Segment A to form a segmented polymer, a material can be obtained which is suitable for a solid polyelectrolyte and has all of ion conductivity, acid resistance, alkali resistance, heat resistance, durability and good mechanical properties.

In the multi-segmented fluoropolymer comprising Segments C and D, the sulfonic acid functional group content of Segment C, i.e., the amount of sulfonic acid functional group-containing fluoromonomer unit relative to the polymer chain segment C alone, can be selected according to desired ion conductivity and mechanical properties of the solid polyelectrolyte, and is usually about 10 mol % to 60 mol %, preferably 13 mol % to 50 mol %, more preferably 20 mol % to 40 mol %.

The sulfonic acid functional group content of Segment D, i.e., the amount of sulfonic acid functional group-containing fluoropolymer unit in the polymer chain segment D alone, can be selected according to desired ion conductivity and mechanical properties of the solid polyelectrolyte, and is usually 0.1 mol % to 20 mol %, preferably 1 mol % to 13 mol %, more preferably 1 mol % to 10 mol %. The sulfonic acid functional group content of Segment D should not exceed that of Segment C.

The sulfonic acid functional group content of the segmented fluoropolymer comprising Segments A and B is 10 mol % to 60 mol %, preferably 13 mol % to 50 mol %, more preferably 20 mol % to 40 mol %.

Too low a sulfonic acid group content of the segmented fluoropolymer results in insufficient ion conductivity, whereas too high a sulfonic acid group content leads to excessive swelling with water or lowered mechanical properties.

The process for combining Segment A with Segment B, or Segment C with Segment D, to form a segmented polymer can be selected according to whether the segmented polymer is a graft polymer or a block polymer. The iodine transfer polymerization can be employed to effectively synthesize a block segmented polymer of a structure such as: A-B, B-A-B or A-B-A; or C-D, D-C-D or C-D-C, with a high percentage of block formation.

The following is an example of a process for preparing a block segmented polymer of a structure B-A-B (D-C-D).

(Segment A or C)

For Example, monomers (a) and (b) for forming Segment A are subjected to emulsion polymerization under substantially anoxic conditions in an aqueous medium in the presence of an iondine compound, preferably a diiodine compound, under pressure with stirring, using a radical polymerization initiator.

Segment C can be synthesized in the same manner as above except using the monomers (c) and (d) for forming Segment C in place of the monomers (a) and (b).

Typical examples of usable diiodine compounds include 1,3-diiodide perfluoropropane, 1,4-diiodide perfluorobutane, 1,3-diiodide-2-chloroperfluoropropane, 1,5-diiodide-2,4-dichloroperfluoropentane, 1,6-diiodide perfluorohexane, 1,8-diiodide perfluorooctane, 1,12-diiodide perfluorododecane and 1,16-diiodide perfluorohexadecane, diiodide methane and 1,2-diiodide ethane. These compounds may be used singly or in combination. Among these compounds, 1,4-diiodide perfluorobutane is preferable. The amount of the diiodine compound is 1.01 to 1 wt. % based on the total weight of Segment A or C.

In the present invention, the radical polymerization initiator for use in the preparation of Segment A or C may be any of radical polymerization initiators conventionally used for preparation of a fluoroelastomer. Such initiators include organic or inorganic peroxides and azo compounds. Typical initiators include persulfuric acid salts, carbonate peroxides and ester peroxides, and preferred initiators include ammonium persulfate (APS). APS may be used singly, or may be in combination with sulfites, sulfurous acid salts or like reducing agents.

The emulsifier for use in the emulsification polymerization can be selected from a wide range, and is preferably a salt of carboxylic acid having a fluorocarbon chain or a fluoropolyether chain, to inhibit chain transfer reaction to a molecule of the emulsifier during polymerization. The amount of the emulsifier to be used is preferably about 0.05 to 15 wt. %, in particular 0.2 to 10 wt. %, relative to water added.

The polymer for Segment A or C thus obtained has, at its end portions (for example, at both ends), an iodine atom which serves as a starting point for polymerization to form the polymer chain segment B or D.

(Block Polymerization to Form Segment B or D)

Block polymerization to form Segment B or D can be carried out subsequent to the emulsification polymerization to obtain Segment A or C, using the monomers for forming Segment B or D, to thereby obtain a block segmented polymer having a structure of B-A-B or D-C-D.

Preferred molecular weights of the segments of the obtained segmented polymer are as follows. Segment A: 5000 to 1000000, in particular 20000 to 500000; Segment B (total molecular weight of Segment B's at both ends): 1000 to 1200000, in particular 3000 to 600000; Segment C: 1000 to 1000000, in particular 10000 to 500000; Segment D (total molecular weight of Segment D's at both ends): 1000 to 1200000, in particular 3000 to 600000. Too low a molecular weight results in insufficient mechanical properties, whereas too high a molecular weight impairs properties for forming a film or membrane.

The ratio of Segment A to Segment B (total of Segment B's at both ends) in the segmented polymer of the invention comprising Segments A and B is selected according to desired ion conductivity, mechanical properties and other characteristics of the solid polyelectrolyte. The ratio is selected preferably from the range of Segment A:Segment B=5:95 to 98:2 (wt. %), more preferably from the range of Segment A:Segment B=20:80 to 95:5 (wt. %), particularly from the range of Segment A:Segment B=30:70 to 90:10 (wt. %).

Too small a proportion of Segment B fails to sufficiently improve the mechanical properties, whereas too large a proportion of Segment B results in insufficient ion conductivity.

The ratio of Segment C to Segment D (total of Segment D's at both ends) in the segmented polymer of the invention comprising Segments C and D is selected according to desired ion conductivity, mechanical properties and like characteristics of the solid polyelectrolyte, and the composition of each segment. The ratio may be selected preferably from the range of Segment C:Segment D=5:95 to 98:2 (wt. %), more preferably from the range of Segment C:Segment D=20:80 to 95:5 (wt. %), particularly from the range of Segment C:Segment D=30:70 to 90:10.

Too small a ratio of Segment B or D fails to sufficiently improve the mechanical properties, whereas too large a ratio of Segment B or D results in insufficient ion conductivity.

As stated above, a variety of segmented fluoropolymers containing sulfonic acid functional groups can be obtained. Among them, one having an equivalent weight of 400 to 1600 (based on the whole segmented polymer), as measured by a known neutralization titration method, is selected for use as a solid polyelectrolyte in fuel cells or the like. Particularly useful is one having an equivalent weight of 500 to 1200, preferably 700 to 1100, based on the whole segmented polymer.

In particular, to impart good mechanical properties to the whole segmented fluoropolymer comprising segments C and D, it is suitable that the fluoropolymer chain segment D has an equivalent weight of at least 1000, preferably at least 1300, more preferably at least 1500.

Too large an equivalent weight results in insufficient ion conductivity, whereas too small an equivalent weight leads to excessive hydration, excessive swelling and excessive gas permeability of the segmented polymer, and also to lower mechanical properties.

As used herein, Segment $A^1$, Segment $B^1$, Segment $C^1$ and Segment $D^1$ are all included in the scopes of Segment A, Segment B, Segment C and Segment D, respectively.

A multi-segmented fluoropolymer comprising a fluoropolymer chain segment $A^1$ and a fluoropolymer chain segment $B^1$ is a novel substance which is included in the scope of the multi-segmented fluoropolymer comprising the fluoropolymer chain segment A and the fluoropolymer chain segment B.

In the multi-segmented fluoropolymer comprising the fluoropolymer chain segment $A^1$ containing sulfonic acid functional groups and the fluoropolymer chain segment $B^1$ containing no sulfonic acid functional groups:

Segment $A^1$ is a copolymer having a molecular weight of 5000 to 750000 and comprising:

(e) 1 to 50 mol % of at least one type of structural unit represented by Formula (1)

$$CX_2=CX^1-(O)_n-Rf-SO_2Y \qquad (1)$$

wherein X, $X^1$, Y, n and Rf are as defined above, and (f) 99 to 50 mol % of at least one type of ethylenic monomer structural unit containing no sulfonic acid functional groups; and Segment $B^1$ is a fluoropolymer chain containing at least one type of ethylenic fluoromonomer unit and having a molecular weight of 3000 to 1200000.

The ethylenic fluoropolymer (e) containing sulfonic acid functional groups is preferably a compound represented by Formula (2)

$$CF_2=CFO-Rf-SO_2Y \qquad (2)$$

wherein Y and Rf are as defined for Formula (1).

The ethylenic monomer (f) containing no sulfonic acid functional groups is preferably one selected from ethylenic fluoromonomers, more preferably tetrafluoroethylene.

Segment $B^1$ is preferably a polymer chain comprising 85 to 100 mol % of tetrafluoroethylene and 15 to 0 mol % of a monomer represented by Formula (3)

$$CF_2=CF-Rf^a \qquad (3)$$

wherein $Rf^a$ is $CF_3$ or $ORf^b$ (wherein $Rf^b$ is $C_1$ to $C_5$ perfluoroalkyl).

In the multi-segmented fluoropolymer comprising at least two types of fluoropolymer chain segments $C^1$ and $D^1$ containing sulfonic acid functional groups, Segment $C^1$ is a copolymer having a molecular weight of 5000 to 750000 and comprising:

(g) 13 to 50 mol % of at least one type of ethylenic fluoromonomer structural unit containing sulfonic acid functional groups and represented by Formula (1)

$$CX_2=CX^1-(O)_n-Rf-SO_2Y \qquad (1)$$

wherein X, $X^1$, Y, n and Rf are as defined above, and (h) 87 to 50 mol % of at least one type of ethylenic monomer structural unit containing no sulfonic acid functional groups; and Segment $D^1$ is a fluoropolymer chain having a molecular weight of 3000 to 1200000 and comprising:

(i) not less than 0.1 mol % but less than 13 mol % of at least one type of ethylenic fluoromonomer structural unit containing sulfonic acid functional groups and represented by Formula (1)

$$CX_2=CX^1—(O)_n—Rf—SO_2Y \quad (1)$$

wherein X, $X^1$, Y, n and Rf are as defined above; and (j) more than 87 mol % but not more than 99.9 mol % of at least one type of ethylenic monomer structural unit containing no sulfonic acid functional groups.

The ethylenic fluoromonomer (g) containing sulfonic acid functional groups is preferably a compound represented by Formula (2)

$$CF_2=CFO—Rf—SO_2Y \quad (2)$$

wherein Y and Rf are as defined for Formula (1).

The ethylenic monomer (h) containing no sulfonic acid functional groups is preferably one having at least one ethylenic fluoromonomer, more preferably tetrafluoroethylene.

The ethylenic fluoromonomer (i) containing sulfonic acid functional groups is preferably a compound represented by Formula (2)

$$CF_2=CFO—Rf—SO_2Y \quad (2)$$

wherein Y and Rf are as defined for Formula (2).

The ethylenic monomer (j) containing no sulfonic acid functional groups is preferably one having at least one ethylenic fluoromonomer, more preferably tetrafluoroethylene.

A solid polyelectrolyte membrane can be prepared by a conventional process using the multi-segmented fluoropolymer of the present invention.

In the solid polyelectrolyte membrane, the multi-segmented fluoropolymer preferably contains protonated sulfonic acid ($SO_3H$) groups as the sulfonic acid functional groups. The solid polyelectrolyte membrane preferably has a modulus of elasticity of at least $1\times10^8$ dyn/cm$^2$ at 110° C. or higher, more preferably at least $1\times10^8$ dyn/cm$^2$ at 150° C. or higher, most preferably at least $3\times10^8$ dyn/cm$^2$ at 110° C. or higher.

The solid polyelectrolyte membrane of the present invention has an equivalent weight, based on the whole multi-segmented fluoropolymer, of 1600 or less, preferably 1100 or less, more preferably 1000 or less, still more preferably 900 or less, particularly 800 or less.

The solid polyelectrolyte membrane has a thickness of about 30 μm to 500 μm, preferably 40 μm to 400 μm, more preferably 50 μm to 300 μm, on a dry weight basis.

The solid polyelectrolyte material or solid polyelectrolyte membrane of the invention can be utilized to prepare a fuel cell.

Fuel cell components other than the solid polyelectrolyte material or solid polyelectrolyte membrane are not limited, and may be any of those known. For example, usable as a gas diffusion electrode is a porous sheet to which a conductive carbon black powder bearing a particulate platinum catalyst is bonded with PTFE, FEP or like hydrophobic resin binder.

BEST MODE FOR CARRYING OUT THE INVENTION

The following examples and comparative examples are provided to illustrate the present invention in further detail, and not to limit the scope of the invention.

SYNTHESIS EXAMPLE 1

Synthesis of Fluoropolymer Chain Containing Sulfonic Acid Fluoride Groups, Corresponding to Segment A or C A 500 ml stainless steel autoclave equipped with a stirrer, a thermometer and a pressure gauge was charged with 225 g of pure water, 25 g of an emulsifier represented by Formula (4)

$$CF_3CF_2CF_2OCF(CF_3)COONH_4 \quad (4),$$

5.0 g of a monomer containing sulfonic acid fluoride groups (hereinafter referred to briefly as "PFSF") represented by Formula (5)

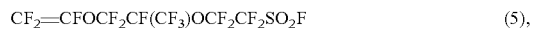
$$CF_2=CFOCF_2CF(CF_3)OCF_2CF_2SO_2F \quad (5),$$

and 0.1 g of a diiodine compound I—$(CF_2)_4$—I. After fully purging the system with nitrogen gas, the internal temperature was maintained at 60° C. with stirring, and tetrafluoroethylene gas was supplied so that the internal pressure became 1.5 kgf/cm$^2$G. Then, 5.0 ml of 0.1% aqueous solution of ammonium persulfate (APS) was injected under nitrogen pressure to initiate a reaction. The pressure decreased as the polymerization reaction proceeded, and when the pressure decreased to 1.0 kgf/cm$^2$G, tetrafluoroethylene gas was supplied to increase the pressure to 1.5 kgf/cm$^2$G. The decrease and increase of the pressure were repeated. From the start of the polymerization, while continually supplying tetrafluoroethylene gas, 2.5 g of the sulfonic acid fluoride group-containing monomer (PFSF) was injected each time 1.5 g of tetrafluoroethylene gas was consumed, to continue polymerization. Tetrafluoroethylene gas was supplied 9 times (22.5 g) in total. When 15 g of tetrafluoroethylene gas was consumed, the supply was stopped. Then, the autoclave was cooled, and unreacted monomers were released, giving 293 g of an aqueous dispersion having a solid concentration of 13.6%.

1 g of the aqueous dispersion was taken, and frozen for coagulation. After thawing, the coagulation product was washed with water and vacuum-dried to obtain a white polymer.

The obtained white polymer was completely soluble in perfluorobenzene, HCFC-225 or like fluorine-containing solvent.

$^{19}$F-NMR analysis revealed that the monomer composition of the polymer was TFE/PFSF=74.5/25.5 mol %.

No crystalline melting point was observed in DSC analysis.

EXAMPLE 1

Block Copolymerization to Form Segment B (B-A-B)

The same 500 ml autoclave as used in Synthesis Example 1 was charged with 120 g of the aqueous dispersion of the sulfonic acid fluoride group-containing fluoropolymer obtained in Synthesis Example 1 (having a concentration of 13.6%) and 120 g of pure water. After fully purging the system with nitrogen gas, the internal temperature was maintained at 60° C. with stirring.

A gaseous monomer mixture of tetrafluoroethylene/perfluoropropylvinyl ether (PPVE) (97 mol %/3 mol %) previously prepared in a cylinder, was injected so that the internal pressure became 7.5 kgf/cm$^2$G. Then, 3 ml of 0.1% aqueous solution of ammonium persulfate (APS) was injected under nitrogen pressure to initiate a reaction. The pressure decreased as the polymerization reaction proceeded, and when the pressure decreased to 7.0 kgf/cm²G, the above gaseous monomer mixture was supplied to increase the pressure to 7.5 kgf/cm²G. The decrease and increase of the pressure were repeated, while supplying the tetrafluoroethylene/PPVE gaseous monomer mixture. When 7.0 g of the gaseous monomer mixture was consumed from the start of the polymerization, the supply was stopped. Then, the autoclave was cooled and unreacted monomers were released, giving 245 g of an aqueous dispersion having a solid concentration of 9.5%. The percentage of Segment B to the whole polymer was calculated from the increase in amount of the polymer:

{(Amount of polymer obtained by second polymerization)−(Amount of polymer used in second polymerization)}/(Amount of polymer obtained by second polymerization)×100=30%

The aqueous dispersion was frozen for coagulation, and the coagulated polymer was washed with water and dried to obtain a white polymer.

The obtained polymer was insoluble in perfluorobenzene, HCFC-225 or like fluorine-containing solvents.

$^{19}$F-NMR analysis revealed that the monomer composition of the whole segmented polymer was TFE/PFSF/PPVE=85.1 mol %/13.9 mol %/1.0 mol %.

DSC analysis observed a crystalline melting point at 303° C., which was attributable to Segment B added by the second polymerization.

EXAMPLE 2

Block Copolymerization to Form Segment B (B-A-B)

The procedure of Example 1 was followed. That is, the 500 ml autoclave was charged with 120 g of the aqueous dispersion obtained in Synthesis Example 1 (concentration: 13.6%) and 120 g of water. After fully purging the system with nitrogen gas, the internal temperature was maintained at 60° C. with stirring.

A gaseous monomer mixture of tetrafluoroethylene/perfluoro(propylvinyl ether) (97 mol %/3 mol %) previously prepared in a cylinder was injected so that the internal pressure became 6.0 kgf/cm²G. Subsequently, 1.5 ml of a 0.1% aqueous solution of ammonium persulfate (APS) was injected under nitrogen pressure to initiate a reaction. The pressure decreased as the polymerization reaction proceeded, and when the pressure decreased to 5.5 kgf/cm²G, the above gaseous monomer mixture was supplied to increase the pressure to 6.0 kgf/cm²G. The decrease and increase of the pressure were repeated while supplying the tetrafluoroethylene/PPFE gaseous monomer mixture. When 3.3 g of the gaseous monomer mixture was consumed from the start of the polymerization, the supply was stopped. Then, the autoclave was cooled, and the unreacted monomers were released, giving 249 g of an aqueous dispersion having a solid concentration of 7.9%. The percentage of Segment B to the whole polymer was calculated from the increase in amount of the polymer:

{(Amount of polymer obtained by second polymerization)−(Amount of polymer used in second polymerization)}/(Amount of polymer obtained by second polymerization)×100=17%

The aqueous dispersion was frozen for coagulation, and the coagulated polymer was washed with water and dried to obtain a white polymer.

The obtained polymer was insoluble in perfluorobenzene, HCFC-225 or like fluorine-containing solvent.

$^{19}$F-NMR analysis revealed that the monomer composition of the whole segmented polymer was TFE/PFSF/PPVE=81.8 mol %/17.7 mol %/0.5 mol %.

DSC analysis observed a crystalline melting point at 301° C., which was attributable to Segment B added by the second polymerization.

EXAMPLE 3

Measurement of Equivalent Weight, Water Content and Dynamic Viscoelasticity

The segmented fluoropolymer containing sulfonic acid fluoride ($-SO_2F$) groups and obtained in Example 1 was used. The sulfonic acid fluoride groups were hydrolyzed in the manner described above, for conversion into sulfonic acid ($-SO_3H$) groups. Thereafter, the equivalent weight, water content and dynamic viscoelasticity were measured. Table 1 shows the results.

(1) Hydrolysis of $-SO_2F$ Groups

The white solid obtained in Example 1 was fully impregnated with an aqueous solution of 25% NaOH, and allowed to stand at 90° C. for 8 hours. The solid was then impregnated with an aqueous solution of 6N HCl at room temperature for 4 hours, followed by drying at 110° C. for 6 hours.

(2) Measurement of Equivalent Weight

Equivalent weight means weight (g) of a polymer necessary to completely neutralize 1 equivalent of a base (for example, 1 equivalent of sodium hydroxide). Using a predetermined amount of the segmented fluoropolymer after hydrolysis and drying, the $SO_3H$ groups in the polymer were completely neutralized in an aqueous solution of excess NaOH. The amount of NaOH remaining after the neutralization was determined by titration with an aqueous solution of 0.1N HCL to calculate the equivalent weight of NaOH that had participated in the neutralization (reverse titration). Then, the equivalent weight of the polymer was calculated.

Further, a film was prepared in the following manner using the polymer of Example 1. The water content and dynamic viscoelasticity of the obtained water-containing film were measured.

(3) Film Preparation

The segmented fluoropolymer containing $-SO_2F$ groups and obtained in Example 1 was placed in a mold of 100 mm diameter, and the mold was mounted on a pressing machine set at 350° C. After 20-minute preliminary heating, compression molding was performed at 70 kg/cm² for 1 minute to obtain a 0.2 mm thick film. The obtained film containing $-SO_2F$ groups was treated in the same manner as in (1) for hydrolysis and drying.

(4) Measurement of Water Content

The dry film obtained in (3) was immersed in boiled pure water, and allowed to stand for 30 minutes. After wiping off water drops from the film surface and measuring the weight ($W_1$) of the film, the film was dried at 110° C. for 16 hours, followed by measurement of the weight ($W_2$).

The water content was calculated according to the following equation:

$$\Delta W = 100 \times (W_1 - W_2)/W_2 (\%)$$

Figure 2:
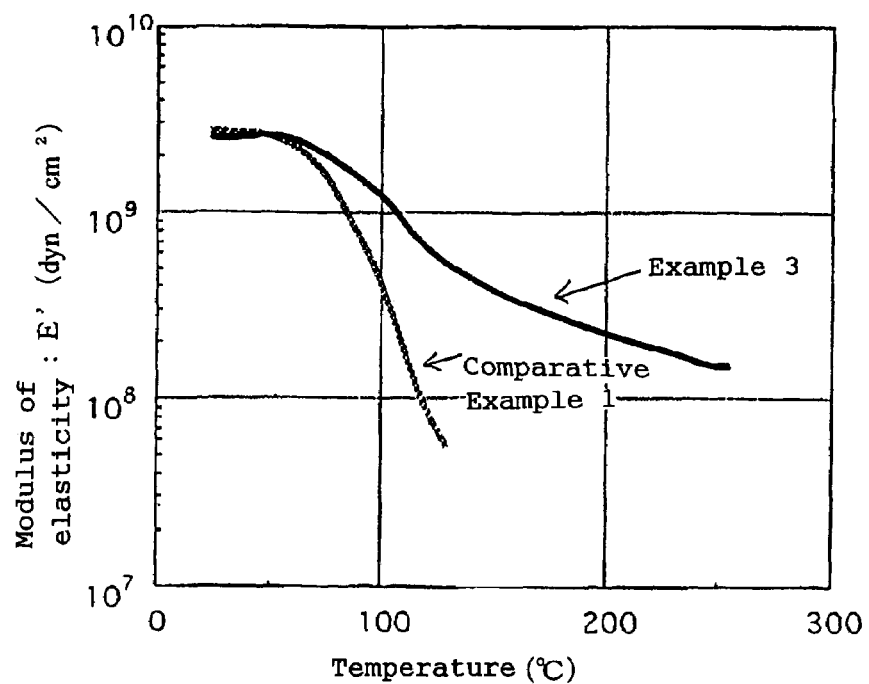
FIG. 2 is a graph showing the relation between the temperature and modulus of elasticity of the polymers obtained in Example 3 and Comparative Example 1.

(5) Calculation of Modulus in Tension from Measurement of Dynamic Viscoelasticity Water was incorporated, in the same manner as in (4), into a film obtained by the above process (3). Immediately after incorporation of water, a rectangle (about 35 mm×5 mm) was cut out from the film and set on a viscoelasticity measuring device RSA-2 (a product of Rheometric) to measure the modulus in tension at a frequency of 1 Hz at various temperatures. Table 1 and FIG. 2 show the results.

EXAMPLE 4

Measurement of Equivalent Weight and Water Content

Hydrolysis, measurement of the equivalent weight, film preparation and measurement of water content were performed in the same manner as in Example 3 except using the segmented fluoropolymer containing sulfonic acid fluoride (—SO$_2$F) groups obtained in Example 2. Table 1 shows the results.

COMPARATIVE EXAMPLE 1

The equivalent weight, water content and dynamic viscoelasticity of a Nafion® 117 membrane (manufactured by Du pont, a film having a thickness of 7 mil, i.e., about 170 μm, in a dry state) were measured in the same manner as in Example 3. Table 1 and FIG. 2 show the results.

TABLE 1

|  | Ex. 3 | Ex. 4 | Ex. 5 |
| --- | --- | --- | --- |
| Test sample | Ex. 1 | Ex. 2 | Nafion 117 |
| M.p.(° C.) of Segment B | 303 | 301 | — |
| Percentage of Segment B (wt.%) | 30 | 17 | — |
| Equivalent weight | 1090 | 990 | — |
| Water content (%) | 28 | 30 | 32 |
| Modulus in tension (dyn/cm$^2$) | | | |
| 25° C. | $1.7 \times 10^9$ | — | $2.7 \times 10^9$ |
| 50° C. | $2.4 \times 10^9$ | — | $2.5 \times 10^9$ |
| 110° C. | $1.0 \times 10^9$ | — | $1.6 \times 10^8$ |
| 150° C. | $3.9 \times 10^8$ | — | Melted |
| 200° C. | $2.1 \times 10^8$ | — | Melted |

EXAMPLE 5

Block Copolymerization to Form Segment D (D-C-D)

In the same manner as in Example 1, the 500 ml autoclave was charged with 120 g of the aqueous dispersion (concentration: 13.6%) obtained in Synthesis Example 1 and 120 g of pure water. After fully purging the system with nitrogen gas, the internal temperature was maintained at 60° C. with stirring.

Tetrafluoroethylene gas was injected so that the internal pressure became 1.5 kgf/cm$^2$G. Then, 1.5 ml of an aqueous solution of 0.1% ammonium persulfate (APS) was injected under nitrogen pressure to initiate a reaction. The pressure decreased as the polymerization reaction proceeded, and when the pressure decreased to 1.0 kgf/cm$^2$G, the above gaseous monomer mixture was supplied to increase the pressure to 1.5 kgf/cm$^2$G. The decrease and increase of the pressure were repeated. From the start of the polymerization, while continually supplying tetrafluoroethylene gas, 0.5 g of the monomer containing sulfonic acid fluoride groups (PFSF) was injected each time 1.2 g of tetrafluoroethylene gas was consumed, to thereby continue the polymerization. The monomer containing sulfonic acid fluoride groups was supplied 9 times (4.5 g) in total. When 12 g of tetrafluoroethylene gas was consumed, the supply was stopped. Then, the autoclave was cooled, and unreacted monomers were released, giving 257 g of an aqueous dispersion having a solid concentration of 13.0%.

The percentage of Segment D to the whole polymer was calculated from the increase in amount of the polymer:

{(Amount of the polymer obtained by the second polymerization)−(Amount of the polymer used in the second polymerization)}/(Amount of the polymer obtained by the second polymerization)
=51.1%

In the same manner as in Example 1, the obtained aqueous dispersion was frozen for coagulation, and the coagulation product was washed with water and dried, to thereby isolate a white solid.

The obtained white solid was insoluble in fluorine-containing solvents such as perfluorobenzene and HCFC-225.

$^{19}$F-NMR analysis revealed that the monomer composition of the whole segmented polymer was TFE/PFSF=85 mol %/15 mol %.

The monomer composition of Segment D calculated from the compositions of the whole polymer and the polymer obtained in Synthesis Example 1 was TFE/PFSF=92 mol %/8 mol %.

DSC analysis observed a crystalline melting point at 285° C., which was attributable to Segment D added by the second polymerization.

The hydrolysate of the dry polymer had an equivalent weight of 1040.

The invention claimed is:

1. A material for a solid polyelectrolyte, comprising a multi-segmented fluoropolymer that comprises a block copolymer and/or a graft copolymer,
    wherein the copolymer contains one or more blocks essentially consisting of segment A and one or more blocks essentially consisting of segment B, the segment A combines with the segment B,
    wherein the segment A has a molecular weight of 5,000 to 1,000,000, and the Segment A is a copolymer chain comprising:
        (a) an ethylenic fluoromonomer containing sulfonic acid functional groups each represented by Formula (1)

$$CX_2=CX^1-(O)_n-Rf-SO_2Y \qquad (1)$$ 

wherein X and X$^1$ may be the same or different and are each hydrogen or fluorine; Y is F, Cl, or OY$^1$ wherein Y$^1$ is hydrogen, alkali metal or C$_1$ to C$_5$ alkyl; Rf is C$_1$ to C$_{40}$ divalent fluoroalkylene or C$_1$ to C$_{40}$ divalent fluoroalkylene having one or more ether bonds; and n is 0 or 1; and
        (b) at least one type of ethylenic fluoromonomer copolymerizable with the ethylenic fluoromonomer (a) and containing no sulfonic acid functional groups,
    the segment B is a fluoropolymer containing no sulfonic acid functional groups, has a molecular weight of 3,000 to 1,200,000, and has a crystalline melting point of 100° C. or higher or a glass transition point of 100° C. or higher,
    wherein the ratio of segment A:segment B in the segmented fluoropolymer is 30:70 to 90:10 wt. %.

2. The material according to claim 1, wherein the fluoropolymer segment B is a polymer comprising 85 to 100 mol % of tetrafluoroethylene and 15 to 0 mol % of a monomer represented by Formula (3)

$$CF_2\!=\!CF\!-\!Rf^a \qquad (3)$$

wherein $Rf^a$ is $CF_3$ or $ORf^b$ wherein $Rf^b$ is $C_1$ to $C_5$ perfluoroalkyl.

3. The material according to claim 1, wherein the multi-segmented fluoropolymer has an equivalent weight of 400 to 1600.

4. A solid polyelectrolyte membrane comprising the multi-segmented fluoropolymer according to claim 1.

5. The solid polyelectrolyte membrane according to claim 4, wherein the multi-segmented fluoropolymer contains protonated sulfonic acid ($SO_3H$) groups as the sulfonic acid functional groups, and has a modulus of elasticity of at least $1\times10^8$ dyn/cm$^2$ at 110° C. or higher.

6. The solid polyelectrolyte membrane according to claim 5, wherein the equivalent weight of the whole multi-segmented fluoropolymer is 1600 or less.

7. The material according to claim 1, wherein the at least one type of ethylenic fluoromonomer (b) containing no sulfonic acid functional groups is tetrafluoroethylene.

* * * * *